United States Patent [19]

Sekino

[11] Patent Number: 5,225,775
[45] Date of Patent: Jul. 6, 1993

[54] IC TESTING DEVICE FOR PERMITTING ADJUSTMENT OF TIMING OF A TEST SIGNAL

[75] Inventor: Takashi Sekino, Saitama, Japan

[73] Assignee: Advantest Corporation, Tokyo, Japan

[21] Appl. No.: 768,587

[22] PCT Filed: Feb. 1, 1991

[86] PCT No.: PCT/JP91/00125
§ 371 Date: Sep. 30, 1991
§ 102(e) Date: Sep. 30, 1991

[87] PCT Pub. No.: WO91/11728
PCT Pub. Date: Aug. 8, 1991

[30] Foreign Application Priority Data
Feb. 2, 1990 [JP] Japan .................... 2-23704

[51] Int. Cl.⁵ .................... G01R 15/12; G01R 31/02
[52] U.S. Cl. .................... 324/158 R; 324/73.1; 324/158 F; 371/25.1
[58] Field of Search ............ 324/73.1, 158 R, 158 F; 371/15.1, 16.1, 25.1, 27

[56] References Cited

U.S. PATENT DOCUMENTS

| | | | |
|---|---|---|---|
| Re. 31,056 | 10/1982 | Chau et al. | 371/25.1 |
| 4,354,268 | 10/1982 | Michel et al. | 324/73.1 |
| 4,497,056 | 1/1985 | Sugamori | 371/25.1 |
| 4,994,732 | 2/1991 | Jeffrey et al. | 324/158 R |

*Primary Examiner*—Vinh Nguyen
*Attorney, Agent, or Firm*—Staas & Halsey

[57] ABSTRACT

An IC testing device in which the timing for sending out test signals and the timings for acquisition of IC output response signals can be adjusted in accordance with delay times ($T_1$ to $T_n$) in transmission lines ($L_1$ to $L_n$) of an IC connection board (81) to which terminals ($P_1$ to $P_n$) of an IC under test (1) are connected. A nonvolatile storage (83) is provided on the IC connection board (81) and data on the delay times ($T_1$ to $T_n$) in the transmission lines ($L_1$ to $L_n$) are prestored in the storage. Even if the IC connection board (81) is replaced with another one, the tester main body of the testing device needs only to read out the data from the storage (83) at the start of testing the IC and to adjust the send-out timing and the acquisition timing, based on the read-out data. Thus, the testing time can be reduced. Also, there in no need to identify the individual IC connection boards (81).

13 Claims, 4 Drawing Sheets

IC TESTING DEVICE FOR PERMITTING ADJUSTMENT OF TIMING OF A TEST SIGNAL

BACKGROUND OF THE INVENTION

1. Field of the Invention

The present invention relates to an IC (semiconductor integrated circuit) testing device.

2. Description of the Related Art

Figure 1:
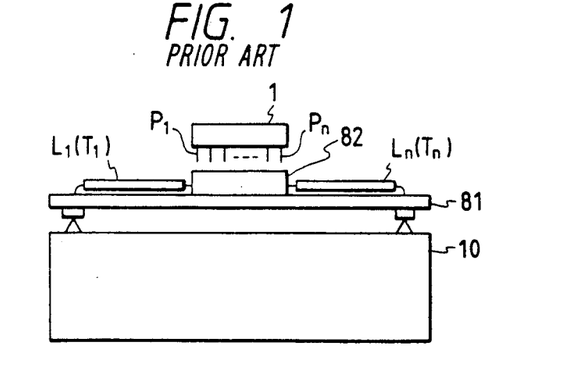
FIG. 1 is a side view of a conventional IC testing device.

An IC testing device comprises, as shown in FIG. 1, a tester main body unit 10 and an IC connection board 81 connected thereto. The IC connection board 81 is called a performance board or test fixture, on which an IC socket 82 is mounted. A plurality of transmission lines $L_1$ to $L_n$ such as coaxial cables or strip lines are provided which join contacts of the IC socket 82 and junctions of the IC connection board 81 with the testing unit 10. The tester main body 10 and the IC connection board 81 are interconnected by urging pin electrodes provided on one of them against planar electrodes provided on the other, by pressing planar electrodes provided on both of them against each other, or by engaging connectors provided on both of them with each other. An IC to be tested 1 is mounted on the IC socket 82.

A signal generator in the tester main body 10, which is called a formatter, generates a test signal of logical levels at specified timings, based on a pattern and a timing signal. The test signal is converted by a driver in the tester main body 10 into a signal voltage of a predetermined level such as the ECL or TTL level, which is supplied from the tester main body 10 to pins $P_1$ to $P_n$ of the IC 1 via the transmission lines $L_1$ to $L_n$ of the IC connection board 81. Then, the resulting IC output response signals derived at the pins $P_1$ to $P_n$ of the IC 1 are provided via the transmission lines $L_1$ to $L_n$ of the IC connection board 81 to the tester main body 10, wherein they are compared by a comparator with a reference voltage for the decision of their logical level. Each logical signal based on the decision is compared by a logical comparator in the tester main body 10 with an expected value pattern contained in the test pattern, and the output form the logical comparator is used to determine whether the IC 1 under test is good or bad.

In this instance, it is necessary that the timing for sending out the test signal and the timing for fetching the IC output response signal in the testing main body 10 be determined taking into account not only the relative delay times between respective circuits in the tester main body 10 corresponding to the pins $P_1$ to $P_n$ of the IC 1 but also delay times $T_1$ to $T_n$ of the transmission lines $L_1$ to $L_n$ of the IC connection board 81 which are connected to the pins $P_1$ to $P_n$ of the IC 1.

Heretofore, there have been proposed the following two methods to adjust the test signal send-out timing and the IC output response signal acquisition timing in accordance with the delay times $T_1$ to $T_n$ of the transmission lines $L_1$ to $L_n$ on the IC connection board 81 corresponding to the pins $P_1$ to $P_n$ of the IC 1.

According to one of the two methods, the transmission lines $L_1$ to $L_n$ are made equal in length to make the above-mentioned delay times $T_1$ to $T_n$ (hereinafter referred to also as the delay times $T_1$ to $T_n$ in the IC connection board 81) constant, and in the tester main body 10, the above-said timing is corrected using data on the constant time. According to the other method, the lengths of the transmission lines $L_1$ to $L_n$, i.e. the above-noted delay times $T_1$ to $T_n$ are measured by a proper method, the measured data are stored in a memory provided in the tester main body 10 and the above-said timing is adjusted using the data read out of the memory.

With the method in which the delay times $T_1$ to $T_n$ in the IC connection board 81 corresponding to the pins $P_1$ to $P_n$ of the IC 1 are made constant by the use of the transmission lines $L_1$ to $L_n$ of the same length and data on the constant time is used to adjust the test signal send-out timing and the IC output response signal acquisition timing in the tester main body 10, the fabrication of the IC connection board 81 is cumbersome and difficult when the IC 1 has a large number of pins.

In the case of employing the method in which the lengths of the transmission lines $L_1$ to $L_n$, i.e. the delay times $T_1$ to $T_n$ in the IC connection board 81 corresponding to the pins $P_1$ to $P_n$ of the IC 1 are measured and the measured data is stored in the memory in the tester main body 10 and is read out therefrom to adjust the above-said timing in the tester main body 10, since a different IC connection board 81 may sometimes be used with the tester main body 10, it is necessary that the IC connection boards 81 be numbered and that measured data group of the delay times $T_1$ to $T_n$ be stored in the memory in the tester main body 10 in correspondence to the respective numbers of the IC connection boards 81; namely, management of the IC connection boards 81 is troublesome and a large-capacity memory is required as the memory in the tester main body 10. In addition, the tester main body 10 must be provided with specific means for reading the number of the IC connection board 81 connected thereto. Besides, since the same IC connection board 81 may sometimes be used with a different tester main body 10, measured data group of the delay times $T_1$ to $T_n$ in the IC connection boards of the respective numbers must be stored in the memories of all the tester main body.

SUMMARY OF THE INVENTION

It is therefore an object of the present invention to provide an IC testing device which permits adjustment of the test signal send-out timing and the IC output response signal acquisition timing in accordance with the delay time in the IC connection board corresponding to each terminal of an IC under test and which allows ease in fabrication and management of the IC connection board and neither requires large-capacity memories for the tester main body and the IC connection board nor calls for providing the tester main body with special means for reading the number of the IC connection board.

According to the present invention, the IC connection board is equipped with a nonvolatile storage for storing data on the delay time in the transmission line on the IC connection board corresponding to each terminal of the IC under test, and the tester main body unit is so constructed as to adjust, the test signal send-out timing and the IC output response signal acquisition timing, based on the data read out of the storage.

In the IC testing device of the above construction according to the present invention, the transmission lines on the IC connection board corresponding to the respective terminals of the IC under test need not be equal in length, and consequently, the fabrication of the IC connection board is easy, even if the IC has a large number of the terminals. In addition, even if different IC connection boards are selectively used with the same tester main body, their management is easy and the tester main body need not be provided with special means for reading the numbers of the IC connection boards, because they need not be numbered. Moreover, since the storage on the IC connection board need only to store data on the delay times in the transmission lines on the IC connection board corresponding to the respective terminals of the IC under test, a small-capacity storage will do, and even if the same IC connection board is used with a different testing main body, the same data need not be stored in a plurality of storages.

According to the present invention, it is also possible to employ a construction in which the IC connection board is provided with a flag register into which is written a flag indicating that the above-mentioned storage has been accessed and which is reset by the connection or disconnection of the power supply to the IC connection board and the tester main body is provided with a file register for storing data read out of the storage and a read/write control circuit which reads the contents of the file register and, when the flag register is in its reset state, sets the flag register and stores data into the file register from the storage. The tester main body adjusts the test signal send-out timing and the IC output response signal acquisition timing, based on the data read out of the file register.

In the IC testing device of the above construction, in particular, when the IC connection board is connected to the tester main body, the read/write control circuit of the tester main body sets the flag register on the IC connection board and loads data from the storage of the IC connection board into the file register of the tester main body. Even if tests are repeatedly made for IC's which are connected to the IC socket one after another, the flag register on the IC connection board remains in the set state unless the IC connection board is disconnected from the testing main body. Accordingly, upon start of the test of each IC, the read/write control circuit of the tester main body needs only to read the contents of the flag register to make sure that the flag register has been set, and data need not be read out of the storage on the IC connection; namely, the test signal send-out timing and the IC output response signal acquisition timing are adjusted, based on data already stored in the file register of the tester main body, and hence the adjustment is made in a very short time. Besides, in the case where the IC connection board is disconnected from the tester main body and is then connected thereto once again or the IC connection board is disconnected from the tester main body and is then connected to a different tester main body, the flag register on the IC connection board is reset by the reconnection of the power supply to the IC connection board, so that data is transferred, without fail, from the storage on the IC connection board to the file register of the same or different tester main body.

DESCRIPTION OF THE PREFERRED EMBODIMENTS

Figure 2:
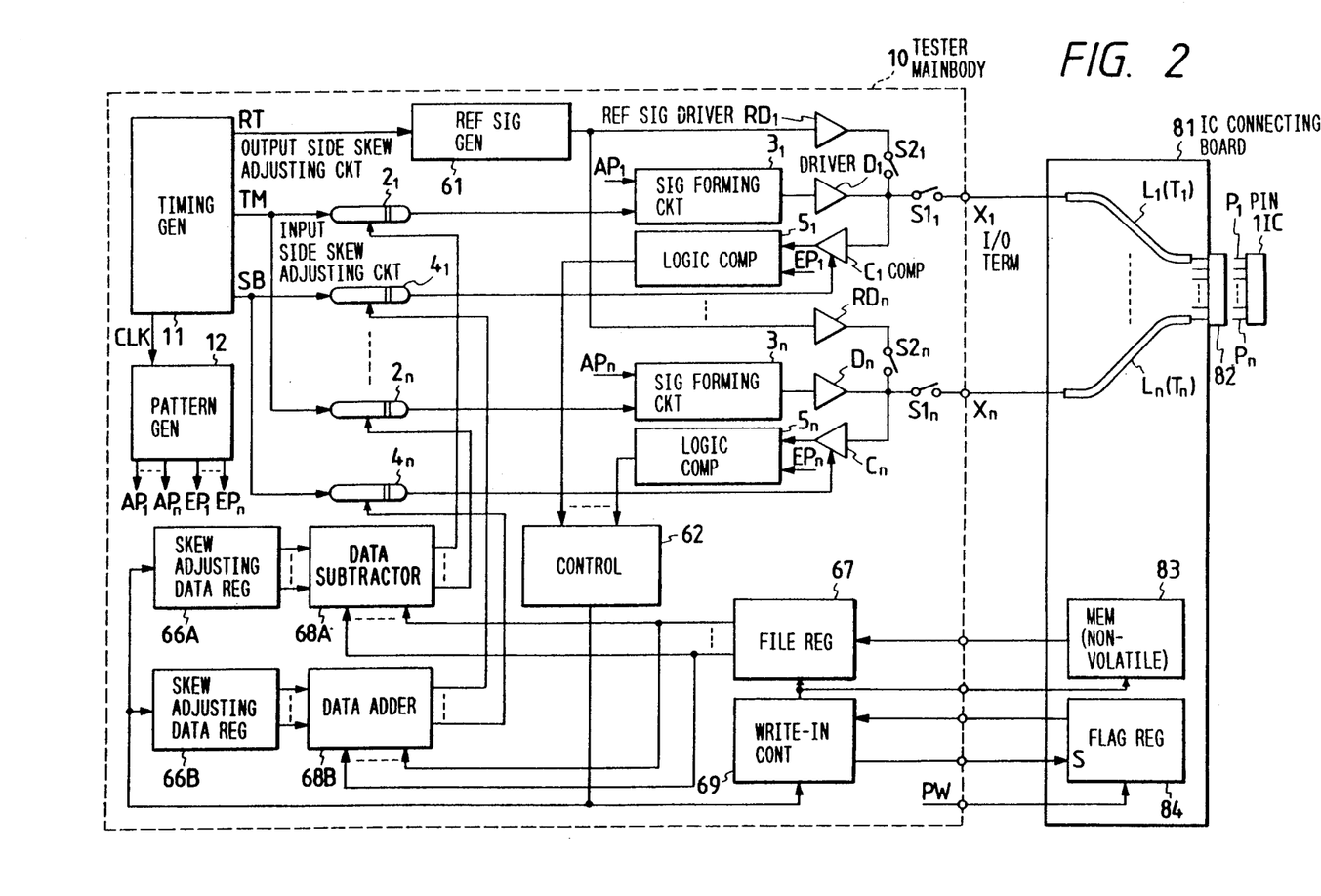
FIG. 2 is a block diagram illustrating an example of the IC testing device of the present invention.
Figure 3:
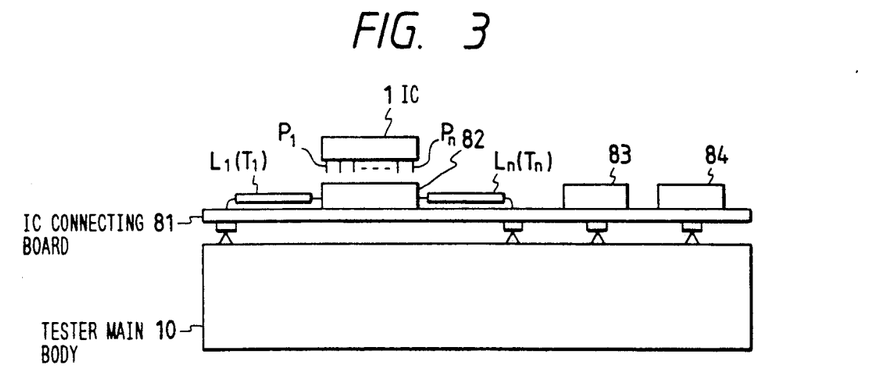
FIG. 3 is a side view of the present invention shown in FIG. 2.

FIGS. 2 and 3 illustrate an embodiment of the IC testing device of the present invention.

The IC testing device is provided with the tester main body 10 and the IC connection board 81. The tester main body includes a timing generator 11, a pattern generator 12, sending-side skew adjusting circuits $2_1$ to $2_n$, signal forming circuits $3_1$ to $3_n$, drivers $D_1$ to $D_n$, I/O relay switches $S1_1$ to $S1_n$, comparators $C_1$ to $C_n$, acquisition-side skew adjusting circuits $4_1$ to $4_n$, logical comparison circuits $5_1$ to $5_n$, a reference signal generation circuit 61, reference signal drivers $RD_1$ to $RD_n$, reference signal interrupting relay switches $S2_1$ to $S2_n$, a controller 62, skew adjusting data registers 66A and 66B, a file register 67, a data subtracter 68A, a data adder 68B and a read/write control circuit 69. The skew adjusting data registers 66A and 66B, the file register 67, the data subtracter 68A and the data adder 68B each have an n-word structure.

The timing generator 11 generates, based on an internal operation clock CLK, a timing signal TM to be applied to the signal forming circuits $3_1$ to $3_n$, a strobe signal SB to be applied to the comparators $C_1$ to $C_n$, and a reference timing signal RT to be applied to the reference signal generator 61. The timing signal TM is provided to the sending-side skew adjusting circuits $2_1$ to $2_n$, wherein its delay is properly adjusted, and the signal thus adjusted is applied therefrom to the corresponding signal forming circuits $3_1$ to $3_n$. The strobe signal SB is provided to the acquisition-side skew adjusting circuits $4_1$ to $4_n$, wherein its delay is properly adjusted, and the signal thus adjusted is applied therefrom to the corresponding comparators $C_1$ to $C_n$. The reference signal generator 61 responds to the reference timing signal RT to generate a reference signal which provides reference timing for obtaining skew adjusting data, and the reference signal is supplied via the drivers $RD_1$ to $RD_D$ to the comparators $C_1$ to $C_n$. The pattern generator 12 operates in synchronization with the operation clock CLK from the timing generator 11 to generate patterns $AP_1$ to $AP_n$ to be provided to the terminal pins $P_1$ to $P_n$ of the IC under test 1 and expected value patterns $EP_1$ to $EP_n$ for comparison with the output response logic from the terminal pins $P_1$ to $P_n$ of the IC under test 1. The patterns $AP_1$ to $AP_n$ are applied to the signal forming circuits $3_1$ to $3_n$, whereas the expected value patterns $EP_1$ to $EP_n$ are provided to the logical comparison circuits $5_1$ to $5_n$.

The signal forming circuits $3_1$ to $3_n$ output the patterns $AP_1$ to $AP_n$ as test signals at the timing of the adjusted timing signals (hereinafter referred to simply as the timing signals) TM provided to the signal forming circuits $3_1$ to $3_n$, respectively. The comparators $C_1$ to $C_n$ each compare the input signal level with the reference level at the timing of the adjusted strobe signal (hereinafter referred to simply as the strobe signals) SB provided thereto, thereby deciding the logic of the input signal. The logical comparators $5_1$ to $5_n$ compare the thus decided logic with the expected value patterns $EP_1$ to $EP_n$ to discern whether they match each other or not. The resulting comparison signals are applied as the test results to the controller 62, and if they contain an unallowable mismatch, then the controller 62 yields a signal indicating that the IC under test 1 is defective, or stores the test results in a storage (not shown) for analyzing them afterwards.

The skew adjusting data register 66A stores therein values of delays to be provided to the sending-side skew adjusting circuits $2_1$ to $2_n$ for causing the timing signal TM to reach the signal forming circuits $3_1$ to $3_n$ simultaneously from the timing generator 11. The skew adjusting data register 66B stores therein values of delays to be provided to the acquisition-side skew adjusting circuits $4_1$ to $4_n$ for causing the strobe signal SB to reach the comparators $C_1$ to $C_n$ simultaneously from the timing generator 11. Incidentally, the structure made up of the timing generator 11, the pattern generator 12, the skew adjusting circuits $2_1$ to $2_n$ and $4_1$ to $4_n$, the signal forming circuits $3_1$ to $3_n$, the logical comparison circuits $5_1$ to $5_n$, the reference signal generator 61, the comparators $C_1$ to $C_n$, etc. is essentially the same as disclosed in, for example, U.S. Pat. No. 4,497,056, and the skew adjustment method for the sending-side and acquisition-side skew adjusting circuits $2_1$ to $2_n$ and $4_1$ to $4_n$ is also described in the above-said U.S. Patent.

On the IC connection board 81 there is mounted the IC socket 82 and the transmission lines $L_1$ to $L_n$ are provided which connect contacts of the IC socket 82 to the junctions between the IC connection board 81 and the tester main body 10. The lengths of the transmission lines $L_1$ to $L_n$ are not the same, in particular, and consequently, the delay times $T_1$ to $T_n$ in the transmission lines $L_1$ to $L_n$ on the IC connection board 81, corresponding to the pins $P_1$ to $P_n$ of the IC 1, are not the same.

The IC connection board 81 further includes a storage 83 and a flag register 84. The storage 83 is a nonvolatile, n-word storage, more specifically, an EPROM, in which is prestored data on the delay times $T_1$ to $T_n$ in the transmission lines $L_1$ to $L_n$ on the IC connection board 81 which correspond to the pins $P_1$ to $P_n$ of the IC 1. The flag register 84 has a one-bit construction, in which is written a flag indicating that the storage 83 has been accessed, as described later on. When connected to the tester main body 10, the IC connection board 81 is supplied with power PW therefrom. The flag register 84 has incorporated therein what is called a power-on reset circuit, and when the IC connection board 81 is connected to the tester main body 10 and is supplied with the power PW, the flag register 84 is reset. It is also possible to employ, as the flag register 84, a register which does not include the power-on reset circuit and whose stored contents are automatically erased upon cutoff of the power supply PW to the IC connection board 81 when it is disconnected from the tester main body 10.

Figure 4:
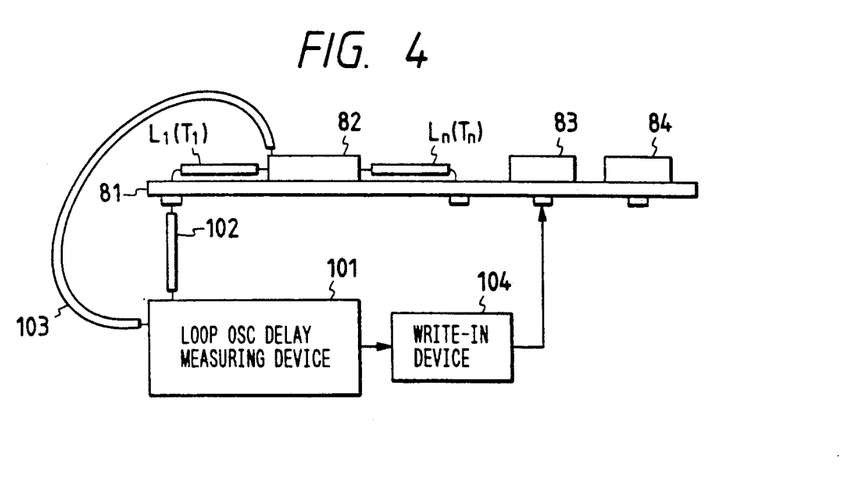
FIG. 4 is a diagram for explaining an example of a method which measures delay times of transmission lines on an IC connection board and stores the measured data on the IC connection board.

FIG. 4 shows an example of a method according to which the afore-mentioned delay times $T_1$ to $T_n$ are measured and the measured data is stored in the storage 83 on the IC connection board 81. In this instance, no IC is mounted on the IC connection board 81. One end of a cable 102 connected at the other end to a loop oscillation type delay time measuring device 101 is connected to one end of one of the transmission lines $L_1$ to $L_n$ on the IC connection board 81 which is connected at the other end to the IC socket 82. Similarly, one end of a cable 103 connected at the other end to the loop oscillation type delay time measuring device 101 is connected to that one of the contacts of the IC socket 82 which is connected to the one end of the above-said one transmission line, thereby forming a loop containing one of the transmission lines $L_1$ to $L_n$ which is connected to the loop oscillation type delay time measuring device 101 via the cables 102 and 103. In this way, loops each containing one of the transmission lines $L_1$ to $L_n$ are formed one after another. Then the delay times $T_1$ to $T_n$ in the transmission lines $L_1$ to $L_n$ are sequentially measured by the loop oscillation type delay time measuring device 101 and obtained as digital data, which is written by a write-in unit 104 into the storage 83 on the IC connection board 81. The measurements of the delay times $T_1$ to $T_n$ and the storing of the measured data into the storage 83 are performed at the stage where the IC connection board 81 has been fabricated.

The tester main body 10 and the IC connection board 81 are connected to each other by pressing pin electrodes provided on one of them and a planar electrode on the other against each other.

In the IC testing device of the above construction, prior to testing each IC, skew adjusting data is stored in each of the skew adjusting data registers 66A and 66B and data on the delay times $T_1$ to $T_n$ in the transmission lines $L_1$ to $L_n$ on the IC connection board 81, corresponding to the pins $P_1$ to $P_n$ of the IC 1, are transferred from the storage 83 to the file register 67, as described hereunder. The data subtracter 68A and the data adder 68B always output the results of subtraction and addition of the contents of the adjusting data registers 66A and 66B and the contents of the file register 67, and amounts of delay corresponding to the results of the subtraction and addition are set in the sending-side skew adjusting circuits $2_1$ to $2_n$ and the acquisition-side skew adjusting circuits $4_1$ to $4_n$, respectively.

At first, the I/O relay switches $S1_1$ to $S1_n$ are turned off and the reference signal interrupting relay switches $S2_1$ to $S2_n$ are turned on, after which a reference signal corresponding to, for example, an H-level test signal, is generated from the reference signal generator 61, based on the reference timing signal RF from the timing generator 11. The reference signal is applied to each of the reference signal drivers $RD_1$ to $RD_n$, in which it is converted to a signal voltage of the ECL or TTL level. The respective signal voltages are applied via the relay switches $S2_1$ to $S2_n$ to the comparators $C_1$ to $C_n$, wherein they are compared with the reference voltage at the timing of the strobe signals SB provided via the acquisition-side skew adjusting circuits $4_1$ to $4_n$ from the timing generator 11, thereby deciding their logic. The output signal from the comparators $C_1$ to $C_n$ are supplied to the logical comparison circuits $5_1$ to $5_n$ for logical comparison with the predetermined expected value patterns $EP_1$ to $EP_n$ (all of which are of the H-level, for example) provided thereto, respectively. In practice, the set amounts of delay of the acquisition-side skew adjusting circuits $4_1$ to $4_n$ are changed in one direction and are thereby adjusted so that the strobe signal SB coincides with the rise-up point of the reference signal which is applied to each of the comparators $C_1$ to $C_n$. The point of coincidence is detected, by the controller 62, as the position where the output logic from each of the logical comparison circuits $5_1$ to $5_n$ is reversed when the set amounts of delay are changed in one direction.

and the set amounts of delay for the adjusting circuits $4_1$ to $4_n$ at the time point of detecting the above-mentioned position are stored, as skew adjusting data for the acquisition-side skew adjusting circuits $4_1$ to $4_n$, in the skew adjusting data register 66B from the controller 62.

Next, the reference signal interrupting relay switches $S2_1$ to $S2_n$ are turned off, after which the timing signal TM is applied from the timing generator 11 to the signal forming circuits $3_1$ to $3_n$ via the sending-side skew adjusting circuits $2_1$ to $2_n$. At the timing of the timing signal thus applied thereto, the signal forming circuits $3_1$ to $3_n$ generate, for example, H-level drive signals following the patterns $AP_1$ to $AP_n$, respectively, and the drive signals are converted by the drivers $D_1$ to $D_n$ to the comparators $C_1$ to $C_n$. On the other hand, the strobe signal SB from the timing generator 11 is applied via the acquisition-side skew adjusting circuits $4_1$ to $4_n$, adjusted as mentioned above, to the comparators $C_1$ to $C_n$ for discerning the logic of the input voltage to each of them. The output logic thus detected is provided to each of the logical comparison circuits $5_1$ to $5_n$ for logical comparison with each predetermined expected value pattern. The set amounts of delay of the sending-side skew adjusting circuits $2_1$ to $2_n$ are adjusted by the controller 62 so that the rise of the drive signal from each of the drivers $D_1$ to $D_n$ coincides with the strobe signal SB which is provided to each of the comparators $C_1$ to $C_n$. The set amount of delay are stored, as skew adjusting data for the sending-side skew adjusting circuits $2_1$ to $2_n$, in the skew adjusting data register 66A.

Finally, as described below, data on the delay times $T_1$ to $T_n$ in the IC connection board 81 corresponding to the pins $P_1$ to $P_n$ of the IC 1 are transferred to the file register 67, and by the data therefrom, the delay times in the sending-side skew adjusting circuits $2_1$ to $2_n$ and the acquisition-side skew adjusting circuits $4_1$ to $4_n$ are adjusted corresponding to the delay times $T_1$ to $T_n$. That is, assuming that the IC connection board 81 is connected to the tester main body 10 at a certain time point, the flag register 84 is in the reset state when the board 81 is connected, because it has been disconnected from the tester main body 10 until then, that is, the power supply PW to the IC connection board 81 has been cut off. Moreover, in the case where the flag register 84 on the IC connection board 81 is the power-on reset type as in the FIG. 2 embodiment, it is reset by the connection of the power supply PW to the IC connection board 81 when the board 81 is connected to the tester main body 10. The read/write control circuit 69 of the tester main body 10 is controlled by the controller 62 to read the contents of the flag register 84 and makes sure that the flag register 84 is "0" or in the reset state, after which the control circuit 69 sets the flag register 84, that is, it writes a flag "1" into the flag register 84, and then reads out of the storage 83 on the IC connection board 81 the data on the delay times $T_1$ to $T_n$ on the IC connection board 81 corresponding to the pins $P_1$ to $P_n$ of the IC 1, thereafter storing the data in the file register 67. Incidentally, the write of the flag into the flag register 84 and the data transfer from the storage 83 to the file register 67 may also be reversed in order.

Upon loading the data on the delay times $T_1$ to $T_n$ into the file register 67, the data subtracter 68A immediately subtracts the contents of the file register 67 from the contents of the skew adjusting data register 66A and sets the amount of delay of each of the sending-side skew adjusting circuits $2_1$ to $2_n$ to the value of the subtracted result. At the same time, the data adder 68B adds the contents of the file register 67 to the contents of the skew adjusting data register 66b and sets the amount of delay of each of the acquisition-side skew adjusting circuits $4_1$ to $4_n$ to the value of the added result.

After the delay times in the sending-side skew adjusting circuits $2_1$ to $2_n$ and the aquisition-side skew adjusting circuits $4_1$ to $4_n$ are thus adjusted, the IC 1 is mounted on the IC socket 82 on the IC connection board 81 and is then tested.

In the case of testing IC's which are mounted one after another on the same IC connection board 81 connected to the tester main body 10, the flag register 84 remains in its set state unless the IC connection board 81 is disconnected from the tester main body 10, because the flag register 84 is already set as referred to above. Accordingly, prior to the start of testing each IC, the read/write control circuit 69 only reads the contents of the flag register 84 to make sure that it has been set, and based on the data already stored in the file register 67, the delay times in the sending-side skew adjusting circuits $2_1$ to $2_n$ and the acquisition-side skew adjusting circuits $4_1$ to $4_n$ are adjusted corresponding to the delay times $T_1$ to $T_n$ as described previously. Thus, this correction, that is, the adjustment of the test signal send-out timing and the IC output response signal acquisition timing, corresponding to the delay times $T_1$ to $T_n$, is made in a very short time.

In the test of each IC, the I/O relay switches $S1_1$ to $S1_n$ of the tester main body 10 are turned on and the reference signal interrupting relay switches $S2_1$ to $S2_n$ are turned off. The signal forming circuits $3_1$ to $3_n$ has the timing specified by the timing signal TM provided thereto via the sending-side skew adjusting circuits $2_1$ to $2_n$ from the timing generator 11 and create test signals of the logical levels corresponding to the patterns $AP_1$ t $AP_n$, respectively. The test signals are converted by the drivers $D_1$ to $D_n$ into signal voltages of predetermined levels, which are supplied from I/O terminals $X_1$ to $X_n$ of the tester main body 10 to the pins $P_1$ to $P_n$ of the IC 1 via the transmission lines $L_1$ to $L_n$ of the IC connection board 81. As a result of this, IC output response signals derived at the pins $P_1$ to $P_n$ of the IC 1 are applied via the transmission lines $L_1$ to $L_n$ of the IC connection board 81 and the I/O terminals $X_1$ to $X_n$ of the tester main body 10 to the comparators $C_1$ to $C_n$, wherein they are compared with the reference voltage at the timing of the strobe signal SB provided from the timing generator 11 via the acquisition-side skew adjusting circuits $4_1$ to $4_n$, by which the logic of each response signal is decided. The output signals of the comparators $C_1$ to $C_n$ are applied to the logical comparison circuits $5_1$ to $5_n$, wherein they are subjected to logical comparison with the expected value patterns $EP_1$ to $EP_n$ provided thereto, and based on the outputs of the logical comparison circuits $5_1$ to $5_n$, it is determined whether the IC under test 1 is good or bad.

Figure 5:
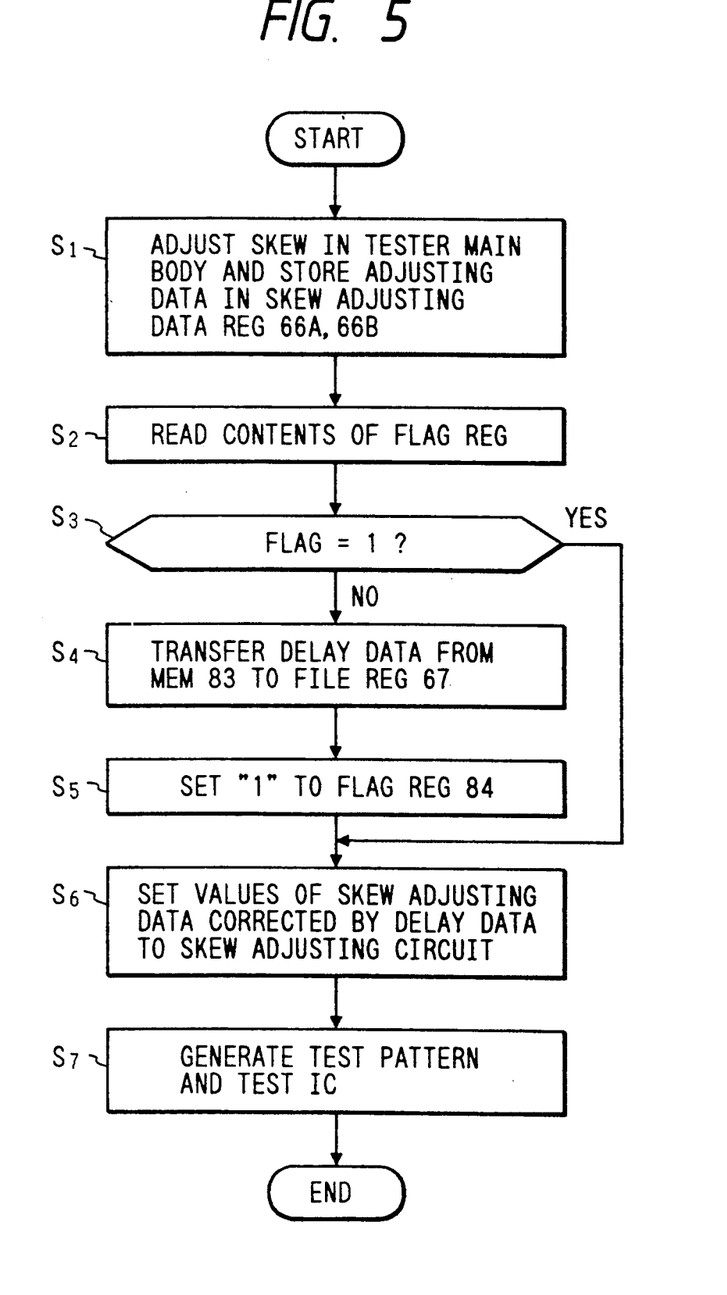
FIG. 5 is a flowchart for explaining the operation of the IC testing device.

FIG. 5 is a simplified flowchart showing the operation of the FIG. 2 embodiment described above. Prior to the start of testing an IC, the IC connection board 81, which has mounted thereon the IC socket 82 of the type corresponding to the IC to be tested, connected to the tester main body 10.

Step $S_1$: At first, the skew adjustment in the tester main body 10 is made, and the skew adjusting data is stored in each of the skew adjusting data registers 66A and 66B.

Step $S_2$: The content of the flag register 68 is read out.

Step $S_3$: It is checked whether the content of the flag register 84 is a "1" or not. If the flag is not a "1", this means that the delay time data in the storage 83 of the IC connection board 81 has not been transferred yet to the file register 67, and the process proceeds to step $S_4$. If the flag is a "1", this means that the contents of the storage 83 of the IC connection board 81 connected to the tester main body 10 have already been transferred to the file register 67, and the process proceeds to step $S_6$.

Step $S_4$: In the case where it is decided in step $S_3$ that the flag is not a "1", the delay times $T_1$ to $T_n$ on the IC connection board 81 corresponding to the pins $P_1$ to $P_n$ of the IC under test are read out of the storage 83 and are transferred to the file register 67.

Step $S_5$: The flag register 84 is set to a "1".

Step $S_6$: The delay times $T_1$ to $T_n$ held in the file register 67 are subtracted from the contents of the skew adjusting data register 66A and the subtracted values are set in the sending-side skew adjusting circuits $2_1$ to $2_n$, and values obtained by adding the delay times $T_1$ to $T_n$ to the contents of the skew adjusting data register 66B are set in the acquisition-side skew adjusting circuits $4_1$ to $4_n$.

Step $S_7$: Test patterns are generated and the IC is tested.

The above steps $S_1$ through $S_7$ are executed for each replacement of the socket 82, testing a series of IC's of the same kinds. The steps $S_4$ and $S_5$ may also be reversed in order.

In the construction shown in FIG. 2, the sending-side skew adjusting circuits $2_1$ to $2_n$ need not always be provided on the paths of the timing signal TM to the signal forming circuits $3_1$ to $3_n$ but may also be on the paths of the test signals from the signal forming circuits $3_1$ to $3_n$ to the drivers $D_1$ to $D_n$. It is also possible to employ an arrangement in which the strobe signal SB from the timing generator 11 is applied to the logical comparison circuits $5_1$ to $5_n$, not to the comparators $C_1$ to $C_n$, and the acquisition-side skew adjusting circuits $4_1$ to $4_n$ are provided on the paths of the strobe signal SB to the logical comparison circuits $5_1$ to $5_n$ or the paths of the output response signals from the comparators $C_1$ to $C_n$ to the logical comparison circuits $5_1$ to $5_n$. In the case of providing the skew adjusting circuits $4_1$ to $4_n$ between the comparators $C_1$ to $C_n$ and the logical comparison circuits $5_1$ to $5_n$, however, the contents of the file register 67 are subtracted from the contents of the skew adjusting data register 66B in the circuits 68B.

Figure 6:
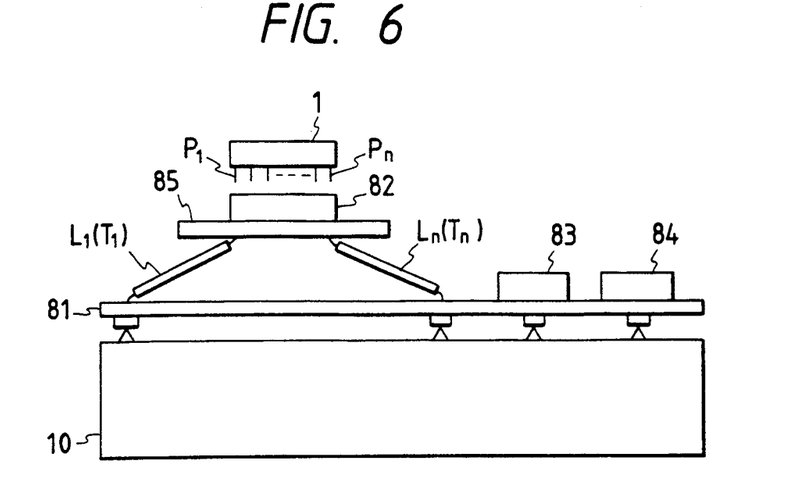
FIG. 6 is a side view of another example of the IC testing device according to the present invention.

It is also possible to adopt such an arrangement as shown in FIG. 6, in which another IC connection board 85, commonly referred to as a socket board, is connected via the transmission lines $L_1$ to $L_n$ to the IC connection board 81 and the IC socket 82 is mounted on the IC connection board 85.

Figure 7:
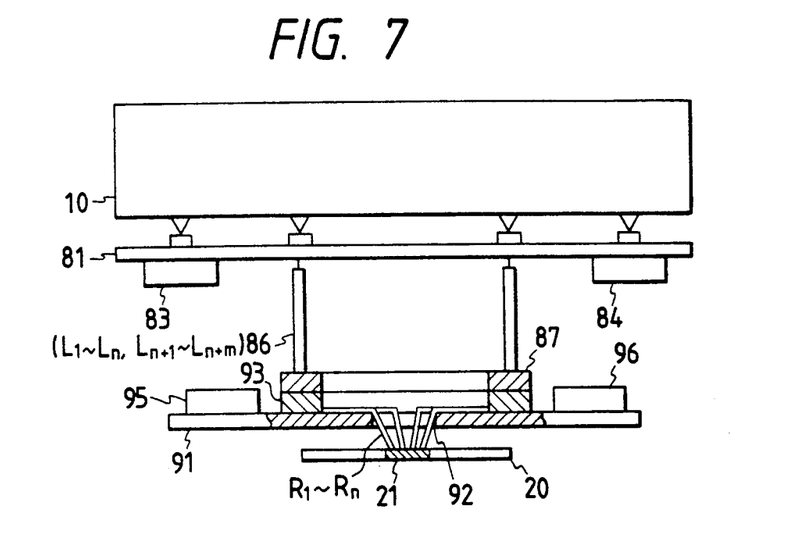
FIG. 7 is a schematic side view of still another example of the IC testing device according to the present invention.
Figure 8:
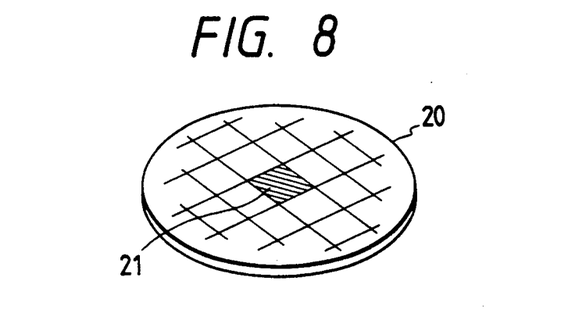
FIG. 8 is a perspective view showing a semiconductor wafer having formed thereon an IC to be tested in FIG. 7.

The present invention is also applicable the testing of an IC 21 which has not been cut out of a semiconductor wafer 20 yet and has not been provided with pins yet as shown in FIGS. 7 and 8.

In this instance, another IC connection board 91 called a probe card is connected to the IC connection board 81. The IC connection board 91 has a hole 92 centrally thereof and elastic contact leads $R_1$ to $R_n$ attached at one end to one side thereof and having their free end portions projecting out of the hole 92 to the other side of the board 91 and an annular connected 93 mounted, for example, on the above-said one side of the board 91, the leads $R_1$ to $R_n$ being connected to the connector 93. In this case, an annular connector 87 is connected to the IC connection board 81 via n+m cables 86 which include the transmission lines $L_1$ to $L_n$ and transmission line $L_{n-1}$ to $L_{n-m}$ for connection to a storage 95 and a register 96 which will hereunder be described. The connectors 87 and 93 are engaged with each other, by which the IC connection board 91 is connected to the IC connection board 81. The contact leads $R_1$ to $R_n$ are elastically contacted with terminals of the IC 21 formed on the semiconductor wafer 20, by which the terminals of the IC 21 are connected to the tester main body 10 via the contact leads $R_1$ to $R_n$ and the transmission lines $L_1$ to $L_2$ formed by the cables 86 of the IC connection board 81.

In the embodiment of FIG. 7 the storage 95 and the flag register 96 are mounted on the IC connection board 91. The storage 95 is a nonvolatile storage, in which delay times in the contact leads $R_1$ to $R_n$, that is, data on the delay times in the leads on the IC connection board 91 corresponding to the terminals of the IC 21, are prestored. The IC connection board 91 is supplied with the power PW via the IC connection board 81 from the tester main body 10 when the IC connection board 81 is connected th the tester main body 10 and the IC connection board 91 is connected to the IC connection board 81. When the power supply is connected to or disconnected from the IC connection board 91, the flag register 96 is reset and its content is cleared to zero.

The tester main body 10 includes a file register for storing data from the storage 95 on the IC connection board 91, though not shown, in addition to the file register 67 for storing data from the storage 83 on the IC connection board 81. The read/write control circuit 69 of the tester main body 10 reads the contents of the flag registers 84 and 96 on the IC connection boards 81 and 91 and, when the flag registers 84 and 96 have been reset, sets them and stores data from the storages 83 and 95 on the IC connection boards 81 and 91 into the corresponding file registers of the tester main body 10. The tester main body 10 adjusts the test signal send-out timing and the IC output voltage acquisition timing, based on the added value of the data from the two file registers.

As described above, in the IC testing device of the present invention, the IC connection board 81 has the nonvolatile storage 83, and for each IC test, the tester main body 10 reads out data on the delay times $T_1$ to $T_n$ in the IC connection board 91 corresponding to the pins $P_1$ to $P_n$ of the IC under test from the storage 83 of the IC connection board 81 or data on the delay times in the IC connection boards 81 and 91 corresponding to the pins of the IC 21 from the storages 83 and 95 on the IC connection boards 81 and 91, and then adjusts the test signal send-out timing and the IC output voltage acquisition timing in accordance with the data thus read out. Accordingly, the lengths of the transmission lines on the IC connection board, corresponding to the terminals of the IC under test, need not be made equal in length—this allows ease in the manufacture of the IC connection board, even if the number of terminals of the IC is large. Furthermore, even if different IC connection boards are selectively used with the same testing unit, management of the IC connection boards is easy and the tester main body need not be provided with special means for identification numbers of the IC connection boards, because such identification numbers are not necessary. Besides, the storage on the IC connection board needs only to store data on the delay times in the IC connection board corresponding to the terminals of the IC under test, and hence the storage may be a small-capacity one. Further, even if the same IC connection board is used with a different tester main body, there is no need of storing the same data in a plurality of storages.

It is also possible to employ an arrangement in which the IC connection board of the IC testing device further includes a flag register and when the IC connection board is connected to the tester main body for each test, the flag register on the IC connection board is set by the read/write control circuit of the tester main body and data is transferred from the storage on the IC connection board to the file register of the tester main body. With such an arrangement, unless the IC connection board is disconnected from the tester main body, the flag register on the IC connection board remains in its set state during testing of a series of IC's, and the read/write control circuit of the tester main body only reads the contents of the flag register to make sure that it is in the set state, and the control circuit does not read out data from the storage on the IC connection board, and the test signal send-out timing and the IC output voltage acquisition timing are adjusted in accordance with the data already stored in the file register of the tester main body. Thus, the adjustment is made in a very short time.

What is claimed is:

1. An IC testing device for testing an IC under test having a plurality of IC terminals, comprising:
   a tester main body having a plurality of tester main body terminals and which derives a plurality of test signals of logical levels from a timing signal and a pattern to be applied to said IC under test, provides the test signals to said plurality of tester main body terminals corresponding to said plurality of IC terminals, compares each of a plurality of output response signals acquired from said IC terminals via said tester main body terminals with a reference voltage to determine a logic level of each output response signal, and makes a logical comparison between said logic level and an expected value pattern; and
   an IC connection board comprising
      a plurality of transmission lines interconnectably coupling said tester main body terminals and said IC terminals; and
      a nonvolatile memory for storing delay time data representative of delay times in said transmission lines of said IC connection board corresponding to said terminals of said IC under test; and
   wherein said tester main body is capable of adjusting timing of said test signals provided to the IC terminals and adjusting acquisition timing of said output response signals acquired from said IC terminals based on said delay time data read from said nonvolatile memory.

2. The IC testing device of claim 1,
   wherein said IC connection board further comprises a flag register; and
   wherein said tester main body comprises control means for reading a state of said flag register when beginning testing of said IC under test and, when said flag register is in a reset state, for effecting control to set said flag register and subsequently read said delay time data from said nonvolatile memory.

3. The IC testing device of claim 2,
   wherein said tester main body further comprises a file register; and
   wherein said control means comprises means for storing in said file register said data read from said nonvolatile memory and, when said flag register is in a set state when beginning testing of said IC under test, for effecting control to adjust the timing of said test signals provided to the IC terminals and adjust the acquisition timing of said output response signals acquired from said IC terminals based on said data stored in said file register.

4. The IC testing device of claim 3, wherein said tester main body further comprises
   first skew adjusting circuits for adjusting the timing of said test signals provided to said IC under test;
   second skew adjusting circuits for adjusting the acquisition timing of said output response signals; and
   delay amount setting means for setting amounts of delay in said first and second skew adjusting circuits, respectively.

5. The IC testing device of claim 4, wherein said delay amount setting means comprises:
   first adjusting data storing means for storing skew adjusting data for said test signals in said tester main body;
   second adjusting data storing means for storing skew adjusting data for said output response signals in said testing main body; and
   calculating means for calculating said amounts of delay to be set in said first and second skew adjusting circuits, based on the contents of said first and second adjusting data storing means and said delay time data in said file register.

6. The IC testing device of claim 3, wherein said control means comprises means for resetting said flag register to be cleared to zero when the power supply thereto is stopped when said IC connection board is disconnected from said tester main body.

7. The IC testing device of claim 3, wherein said flag register comprises a register having a power-on reset function which is reset when the power supply is connected thereto when said IC connection board is connected to said tester main body.

8. The IC testing device of claim 3, further comprising a secondary IC connection board provided opposite said IC connection board, said secondary IC connection board comprising
   a plurality of contact leads connected at one end to said transmission lines and making contact at the other ends of said transmission lines with said IC terminals of said IC under test; and
   another nonvolatile storage means for storing data on delay times in said contact leads.

9. The IC testing device of claim 2, wherein said control means comprises means for resetting said flag register to be cleared to zero when the power supply thereto is stopped when said IC connection board is disconnected from said tester main body.

10. The IC testing device of claim 2, wherein said flag resister comprises a register having a power-on reset function which is reset when the power supply is connected thereto when said IC connection board is connected to said tester main body.

11. The IC testing device of claim 2, further comprising a secondary IC connection board provided opposite said IC connection board, said secondary IC connection board comprising
    a plurality of contact leads connected at one end to said transmission lines and making contact at the other ends of said transmission lines with said IC terminals of said under test; and another nonvolatile storage for storing data on delay times in said contact leads.

12. The IC testing device of claim 11, wherein said second IC connection board further comprises a second flag register; and wherein said control means comprises means for reading from said second flag register when beginning testing of said IC under test and, when in a reset state, for effecting control to set said second flag register, read data from said another nonvolatile storage and then adjust the timing of said test signals and the acquisition timing of said output response signals based on a result of addition of said data read from said another nonvolatile storage and said delay time data read from said nonvolatile memory.

13. An IC testing device having tester main body terminals for testing an IC under test having IC terminals, comprising:

an IC connection board comprising
   a plurality of transmission lines interconnectably coupling the tester main body terminals and the IC terminals; and
   nonvolatile storage means for storing delay time data representative of delay times in said transmission lines of said IC connection board; and a tester main body having said tester main body terminals interconnectably coupled to said IC correction board and comprising means for reading the delay time data from said nonvolatile storage means, for providing test signals to the IC terminals via the tester main body terminals with a timing adjusted in accordance with said delay time data, and for acquiring output response signals from the IC terminals via the tester main body terminals with an acquisition timing adjusted in accordance with the delay time data.

* * * * *

UNITED STATES PATENT AND TRADEMARK OFFICE
CERTIFICATE OF CORRECTION

PATENT NO. : 5,225,775
DATED : JULY 6, 1993
INVENTOR(S) : TAKASHI SEKINO

It is certified that error appears in the above-indentified patent and that said Letters Patent is hereby corrected as shown below:

Col. 1, line 43, "form" should be --from--.

Col. 8, line 36, "$AP_1t$" should be --$AP_1$ to--.

Col. 10, line 3, "$L_{n-1}$ to $L_{n-m}$" should be --$L_{n+1}$ to $L_{n+m}$--.

Col. 13, line 2, "said under test" should be --said IC under test--.

Signed and Sealed this

Nineteenth Day of April, 1994

BRUCE LEHMAN

Attest:

Attesting Officer

Commissioner of Patents and Trademarks